US011967650B2

(12) United States Patent
Saxena et al.

(10) Patent No.: US 11,967,650 B2
(45) Date of Patent: Apr. 23, 2024

(54) SNAPBACK ELECTROSTATIC DISCHARGE PROTECTION DEVICE WITH TUNABLE PARAMETERS

(71) Applicant: Allegro MicroSystems, LLC, Manchester, NH (US)

(72) Inventors: Sagar Saxena, Manchester, NH (US); Washington Lamar, Mont Vernon, NH (US); Maxim Klebanov, Palm Coast, FL (US); Chung C. Kuo, Manchester, NH (US); Sebastian Courtney, Dracut, MA (US); Sundar Chetlur, Frisco, TX (US)

(73) Assignee: Allegro MicroSystems, LLC, Manchester, NH (US)

( * ) Notice: Subject to any disclaimer, the term of this patent is extended or adjusted under 35 U.S.C. 154(b) by 252 days.

(21) Appl. No.: 17/662,101

(22) Filed: May 5, 2022

(65) Prior Publication Data
US 2023/0361223 A1    Nov. 9, 2023

(51) Int. Cl.
*H01L 29/87* (2006.01)
*H01L 29/06* (2006.01)

(52) U.S. Cl.
CPC .......... *H01L 29/87* (2013.01); *H01L 29/0684* (2013.01)

(58) Field of Classification Search
CPC . H01L 29/87; H01L 27/0255; H01L 27/0248; H01L 23/62; H01L 29/861; H01L 27/04; H01L 29/78612
See application file for complete search history.

(56) References Cited

U.S. PATENT DOCUMENTS

| 5,465,189 A | 11/1995 | Polgreen et al. |
| 5,856,214 A | 1/1999 | Yu |
| 6,081,002 A | 6/2000 | Amerasekera et al. |
| 9,318,481 B1 | 4/2016 | Wang et al. |
| 9,368,486 B2 | 6/2016 | Wang et al. |
| 2007/0090392 A1 | 4/2007 | Boselli |
| 2019/0103396 A1* | 4/2019 | Zhan ................... H01L 29/0821 |

OTHER PUBLICATIONS

Office Action dated Sep. 2, 2015 corresponding to U.S. Appl. No. 14/621,766; 7 Pages.

(Continued)

*Primary Examiner* — Wasiul Haider
(74) *Attorney, Agent, or Firm* — Daly, Crowley, Mofford & Durkee, LLP (57) ABSTRACT

In one aspect, a diode includes a substrate having a first type dopant; a buried layer having a second type dopant and formed within the substrate; an epitaxial layer having the second type dopant and formed above the buried layer; and a plurality of regions having the first type dopant within the epitaxial layer. The plurality of regions includes a first region, a second region, and a third region. The diode also includes a base well having the first type dopant and located within the epitaxial layer and in contact with the third and fourth regions. In a reverse-bias mode, the diode is an electrostatic discharge (ESD) clamp and forms parasitic transistors comprising a first bipolar junction transistor (BJT), a second BJT and a third BJT.

17 Claims, 7 Drawing Sheets

(56) References Cited

OTHER PUBLICATIONS

Response to Office Action dated Sep. 2, 2015 corresponding to U.S. Appl. No. 14/621,766; Response filed on Dec. 29, 2015; 9 Pages.
U.S. Notice of Allowance dated Feb. 16, 2016 for to U.S. Appl. No. 14/847,519; 9 pages.
U.S. Notice of Allowance dated Mar. 9, 2016 for to U.S. Appl. No. 14/847,519; 6 pages.
Bafleur et al., "Protecting Mixed-Signal Technologies Against Electrostatic Discharges: Challenges and Protection Strategies from Component to System;" Chapter 3 from the book *Mixed-Signal Circuits*; 1$^{st}$ Edition; Nov. 2015; 42 Pages.

\* cited by examiner

| Reference | Dopant | Doping Concentration | Dimensions (thickness) |
|---|---|---|---|
| p-type substrate 12 | Boron | 5E14 - 1E16 | 300um - 325um |
| n-type epitaxial layer 20 | Arsenic/Phosphorous | 5E14 - 1E16 | 6um - 9um |
| n-type buried layer 16 | Phosphorous | 1E18 - 1E20 | 4um - 6um |
| plug 46 | Phosphorous | 1E18 - 1E20 | 4um - 6um |
| npolly 62a, 62b, 62c | Conductor | NA | 0.1um - 0.2um |
| p-well 30a, 30b, 30c | Boron | 1E16 - 1E18 | 1um - 2um |
| BA 28 | Boron | 1E15 - 1E17 | 1um - 2um |
| STI layer 41 | Dielectric | Dielectric | 0.3um - 0.5um |
| PMD layer 43 | Dielectric | Dielectric | 1um - 2um |
| IMD layer 44 | Dielectric | Dielectric | 0.6um - 1.5um |
| heavily doped n-type regions 36a-36c | Arsenic/Phosphorous | 5E19 - 5E21 | 0.1um - 0.3um |
| heavily doped p-type regions 38a-38c | Boron | 5E19 - 5E21 | 0.1um - 0.3um |
| n-well 40a-40c | Arsenic/Phosphorous | 5E16 - 1E18 | 1um - 2um |
| PA 42 | NA | Dielectric | 1um - 2um |
| DTLiner 54a, 54b | NA | Dielectric | 0.3um - 0.7um |
| Dtpoly 52a, 52b | NA | Trench-fill / NA | 0.8um - 1.5um |

*FIG. 6*

SNAPBACK ELECTROSTATIC DISCHARGE PROTECTION DEVICE WITH TUNABLE PARAMETERS

BACKGROUND

Bipolar-CMOS-DMOS (BCD) technology integrates bipolar transistors with complementary metal oxide semiconductor (CMOS) logic and double diffused metal-oxide-semiconductor (DMOS) transistors. High Voltage BCD technologies (e.g., with operating voltages in excess of 80V), are prone to a circuit failure due to turn-on of a parasitic transistor between wells during an electrostatic discharge event (ESD) event.

Power clamps are circuits that can be used to protect other circuitry from damage due to overvoltage conditions caused by, for example, ESD and other noise events. ESD induced failure is a major concern for integrated circuits in advanced and main-stream technologies. This reliability issue is further worsened in high-voltage technologies because of the latch-up hazard.

SUMMARY

In one aspect, a diode includes a substrate having a first type dopant; a buried layer having a second type dopant and formed within the substrate; an epitaxial layer having the second type dopant and formed above the buried layer; a plurality of regions having the first type dopant within the epitaxial layer, wherein the plurality of regions comprises a first region, a second region, and a third region; a base well having the first type dopant and located within the epitaxial layer and in contact with the third and fourth regions; a first well having the second type dopant and formed in the epitaxial layer; a second well having the first type dopant, and formed in the epitaxial layer, the second well extending into the first region; a third well having the first type dopant located in the epitaxial layer and connected to the base well and connected to the second region and to the fourth region; an anode; a first heavily doped region having the second type dopant connected to the anode and the base well; a second heavily doped region having the second type dopant connected to the anode and the base well; and a cathode. In a reverse-bias mode, the diode is an electrostatic discharge (ESD) clamp and forms parasitic transistors comprising a first bipolar junction transistor (BJT), a second BJT and a third BJT.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to fabricate a diode that performs as an electrostatic discharge (ESD) clamp. In one example, the diode provides high-voltage ESD protection. In one example, the diode is a reduced injection diode (RID). The diode includes tunable snapback parameters such as, for example, trigger voltage, holding voltage, breakdown current and so forth.

In one example, the techniques described herein improve ESD clamp performance. In another example, the techniques allow the snapback parameters to be tunable through changes in mask layout rather than through changes only in doping levels.

In other examples, the diode described herein has a relatively low dynamic resistance of 1 ohm to 4 ohms ±0.5 ohms in a reverse-bias mode compared to Darlington/Stacked Darlington transistors. Also, the diode described herein eliminates a need for traditional ESD clamps like passive Zener or Zener-triggered Darlington circuits that consume a much larger chip area than the diode described herein.

As used herein, the term "holding voltage" is the voltage that is needed to sustain the device/parasitic bipolar actions after the device is triggered on. As used herein, the term "trigger voltage" is the voltage that enables the device to start to conduct current using the parasitic bipolar actions. As used herein, the term "snapback" means that, after being triggered on by avalanche breakdown and impact ionization, a device exhibits a holding voltage smaller than trigger voltage.

Figure 1A:
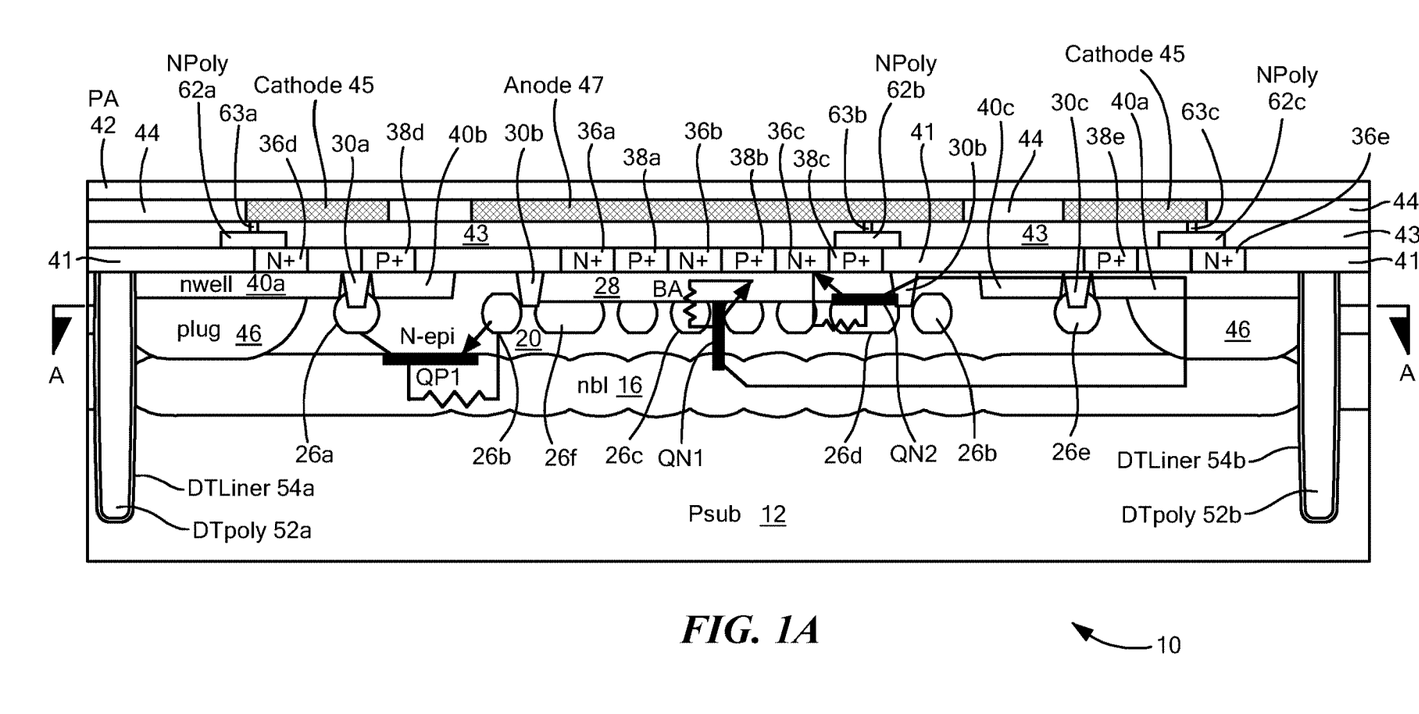
FIG. 1A is a cross-sectional view of a high-level example of a diode used as an electrostatic discharge (ESD) clamp.

Referring to FIG. 1A, a diode 10 is used as an electrostatic discharge (ESD) clamp in a reverse-bias mode. In one example, the diode is a RID. In one example, when the RID is operated in forward-bias mode, it reduces injection of minority carriers into the substrate.

FIG. 1A is only a high-level example of the diode 10. Every layer is not shown in FIG. 1A. FIG. 1A is strictly intended to aid in describing those features, which are novel.

The diode 10 may include a p-type silicon substrate 12 and a n-type buried layer (nbl) 16 within the substrate 12. The diode 10 may also include a n-type epitaxial layer (N-epi) 20 on the buried layer 16.

The n-type epitaxial layer 20 may include a plurality of p-type regions. For example, the plurality of p-type regions may include a first region 26a, a second region 26b, a third region 26c, a fourth region 26d, a fifth region 26e and a sixth region 26f.

The n-type epitaxial layer 20 may also include a p-type base well 28 that may be in direct contact with the third region 26c and the fourth region 26e; a p-type well 30a that extends into the first region 26a; a p-type well 30b that is connected to the base well 28, to the second region 26b and to the fourth region 26d; and a p-type well 30c that extends into the fifth region 26e. The n-type epitaxial layer 20 may further include an n-type well 40a; an n-type well 40b; and an n-type well 40c.

The n-type well 40a is on one side of the p-type well 30a and the n-type well 40b is on the other side of the p-type well 30a. The n-type well 40c is on one side of the p-type well 30c and the n-type well 40a is on the other side of the p-type well 30c. In one example, the n-type well 40a is a ring-shaped well.

The n-type epitaxial layer 20 may further include a plug 46. The plug 46 may be in direct contact with the n-type well 40a and the buried layer 16.

The diode 10 may also include a shallow trench isolation (STI) layer 41 on the epitaxial layer and a pre-metal dielectric (PMD) layer 43 on the STI layer 41. The diode 10 may further include an inter metal dielectric (IMD) layer 44 on the PMD layer 43, and a passivation layer (PA) layer 42 on the IMD layer 44.

The STI layer 41 may include a plurality of heavily doped n-type regions. For example, the plurality of heavily doped n-type regions may include a first heavily doped n-type region 36a, a second heavily doped n-type region 36b, a third heavily doped n-type region 36c, a fourth heavily doped n-type region 36d, and a fifth heavily doped n-type region 36e.

The STI layer 41 may include a plurality of heavily doped p-type regions. For example, the plurality of heavily doped p-type regions may include a first heavily doped p-type region 38a, a second heavily doped p-type region 38b, a third heavily doped p-type region 38c, a fourth heavily doped p-type region 38d, and a fifth heavily doped n-type region 38e.

The PMD layer 43 may include a first n-type polysilicon layer (N-poly 62a), a second n-type polysilicon layer (N-poly 62b), a third n-type polysilicon layer (N-poly 62c), a via 63a connecting the first n-type polysilicon layer (N-poly 62a) to the cathode 45, a via 63b connecting the second n-type polysilicon layer (N-poly 62b) to the anode 47, and a via 63c connecting the third n-type polysilicon layer (N-poly 62c) to the cathode 45. It would be appreciated by one of ordinary skill in the art in view of FIG. 2 that not every via is shown leading to the anode 47 and the cathode 45 in FIG. 1A.

The heavily doped n-type regions 36a, 36b, 36c and the heavily doped p-type regions 38a, 38b, 38c are in direct contact with the base well 28. The heavily doped n-type region 36d and the heavily doped p-type region 38d are located below one end of the cathode 45. The heavily doped n-type region 36e and the heavily doped p-type region 38e are located below the other end of the cathode 45.

The IMD 44 may include cathode layers (e.g., cathode 45) and anode layers (e.g., anode 47). In one example, the cathode 45 may be a ring-shaped cathode.

Figure 1B:
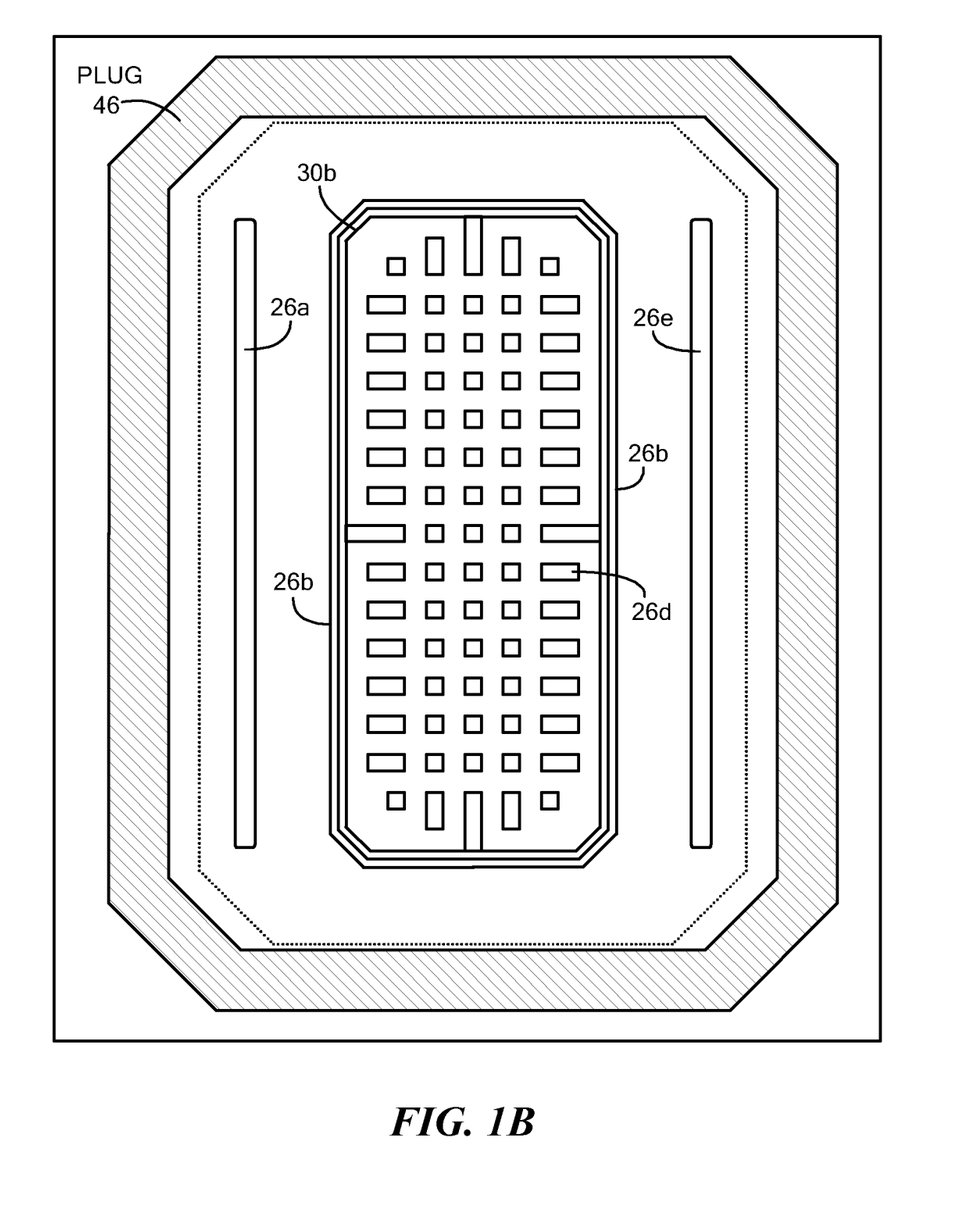
FIG. 1B is a view of the diode of FIG. 1 taken along the line A-A.

Referring to FIG. 1B, in one example, the p-type well 30b is a ring-shaped well. In one example, the plug 46 is a ring-shaped plug.

Referring back to FIG. 1A, in a reverse-bias mode, the diode 10 forms parasitic bipolar junction transistor (BJTs). For example, a first transistor QP1, a second transistor QN1 and a third transistor QN2 are formed in a reverse-bias mode. Once the transistors turn on after reaching their characteristic VcER value, the ESD current paths are from the collector-to-emitter for the parasitic NPNs and PNP.

The first transistor QP1 is a lateral pnp transistor. A collector of the first transistor QP1 is formed by the p-type well 30a and the p-type first region 26a connected to the cathode 45. A base of the first transistor QP1 is formed by the epitaxial layer 20 and the buried layer 16 connected to the cathode 45. An emitter of the first transistor QP1 is formed by the base well 28, the p-type second region 26b and the p-type well 30b connected to the anode 47.

The second transistor QN1 is a vertical npn transistor. An emitter of the second transistor QN1 is formed by the heavily n-type doped regions 36a, 36b, 36c connected to the anode 47. A base of the second transistor QN1 is formed by the base well 28 and the third region 26c connected to the anode 47. A collector the second transistor QN1 is formed by the epitaxial layer 20 and the buried layer 16 connected to the cathode 45.

The number of n-type and p-type heavily doped regions 36a-36e, 38a-38e are only for illustration purposes. One of ordinary skill in the art would recognize that the number of n-type and p-type heavily doped regions 36a-36e, 38a-38e may be much higher than is depicted in FIG. 1.

The third transistor QN2 is a lateral npn transistor. An emitter of the third transistor QN2 is formed by the n-type heavily doped region 36a, 36b, 36c connected to the anode 47. A base of the third transistor QN2 is formed by the base well 28, the fourth region 26d and the p-type well 30b connected to the anode 47. A collector of the third transistor QN2 is formed by the epitaxial layer 20 and the n-type wells 40a, 40c connected to the cathode 45.

Snapback parameters such as trigger voltage, holding voltage and breakdown current may be tunable based on mask level changes. In one example, the thickness of the epitaxial layer 20 can control one or more of the trigger voltage, the holding voltage and/or the breakdown current. In another example, the doping concentration of the epitaxial layer 20 can control the trigger voltage.

In a further example, the trigger hold voltage may be controlled by parameters of the base well 28. For example, one or more of the doping concentration of the base well 28, doping concentration of the base well 28 and/or an amount of extension of the base well 28 beyond the anode 47.

In a still further example, parameters of the buried layer 16 may control one or more of the trigger voltage, the holding voltage and/or the breakdown current. For example, whether or not the buried layer 16 has grids that may control one or more of the trigger voltage, the holding voltage and/or the breakdown current. For example, the grids of the buried layer 16 may be fabricated to have smooth edges, or "bumps" along the edge that changes doping profiles. In another example, the doping concentration of the buried layer 16 may control the breakdown voltage and/or the trigger voltage.

In another example, spacing between the anode 47 and the plug 46 may control the trigger voltage and/or the holding voltage.

Each of the parasitic device parameters of the first transistor QP1, the second transistor QN1 and the third transistor QN2 may affect the parameters of the diode 10 as an ESD clamp. The turn-on voltage of the ESD clamp may be affected by a Vcbo of a parasitic device (e.g., first transistor QP1, the second transistor QN1 and/or the third transistor QN2). The Vcbo is the base-collector breakdown voltage level of a BJT where the emitter is left open or floating. The Vcbo is affected by the collector-base breakdown of a parasitic device.

The trigger voltage versus current of the ESD clamp may be affected by a Vcer of a parasitic device (e.g., first transistor QP1, the second transistor QN1 and/or the third transistor QN2). The Vcer is the collector-emitter breakdown voltage of a BJT where Vcer is a function of the resistance between a base and an emitter. The Vcer may be affected by a resistance between the emitter an the base Rbe and the beta (high current) of a parasitic device.

The holding voltage of the ESD clamp may be affected by the Vceo of a parasitic device (e.g., first transistor QP1, the second transistor QN1 and/or the third transistor QN2). The Vceo may be affected by the beta and a resistance between the base and the emitter, Rbe, of a parasitic device.

The on-resistance of the ESD clamp may be affected by a high current beta of a parasitic device (e.g., first transistor QP1, the second transistor QN1 and/or the third transistor QN2). The high current beta may be affected by the effective resistance of the layers of the parasitic device.

The breakdown current of the ESD clamp may be affected by a stability against current filamentation of a parasitic device (e.g., first transistor QP1, the second transistor QN1 and/or the third transistor QN2). The stability against current filamentation may be affected by the effectiveness of thermal dissipation of the parasitic device. For example, metallization density, substrate thickness, external heat sinks and volume of a parasitic device affect thermal dissipation. In one particular example, the breakdown current of the ESD clamp will be increased if there is a higher metal density, a thicker p-type substrate 12, added heat sinks and/or a larger volume of device 10.

Turning now to the first transistor QP1 specifically, the collector-base breakdown is affected by the diffusion profile of the epitaxial layer 20 and n-type well 40b relative to the base well 28, the p-type second region 26b and the p-type well 30b. Thus, more doping of the epitaxial layer 20 and n-type well 40b lowers the Vcbo and the turn-on voltage. Making the epitaxial layer 20 thinner lowers the Vcbo and the turn-on voltage. Making the distance between the p-type region 26b and the p-type region 26e shorter, also lowers the Vcbo and the turn-on voltage.

Rbe is affected by the doping profile of the epitaxial layer 20 and the distance between the p-type region 26b and the p-type region 26e. The beta is affected by the doping profile of the epitaxial layer 20 relative to the doping profile of the p-type region 26b and the distance between the p-type region 26b and the p-type region 26e. More doping of the epitaxial layer 20 will lower the Rbe and thereby increase the trigger voltage/current. Increasing the doping of the p-type well 30a and the p-type first region 26a, increases the beta and lowers Vcer. Making the epitaxial layer 20 wider and/or thicker lowers the beta and increases Vcer.

Beta and Rbe are affected by the doping profile of the epitaxial layer 20 relative to the base well 28, the p-type second region 26a and the p-type well 30a. Making the epitaxial layer 20 wider increases, Vceo and increases the holding voltage. Making the p-type regions 26a, 26e, and the p-type wells 30a, 30c thicker, increases Vceo and increases the holding voltage.

The on-resistance is affected by the diffusion profile of the layers in series. The layers include the p-type first and second regions 26a, 26b, the p-type wells 30a, 30b, and the base 28; and the epitaxial layer 20 and the buried layer 16. Increasing the doping concentrations of the p-type first and second regions 26a, 26b, the p-type wells 30a, 30b, the base 28, the epitaxial layer 20 and/or the buried layer 16 lowers the on-resistance.

Turning now to the first transistor QN1 specifically, the collector-base breakdown is affected by the diffusion profile of the epitaxial layer 20 and the buried layer 16 relative to the base well 28, the p-type third region 26c and the p-type well 30b. Thus, more doping of the epitaxial layer 20 and the buried layer 16 lowers the Vcbo and lowers the turn-on voltage. Making the epitaxial layer 20 thinner also lowers the Vcbo and lowers the turn-on voltage.

Rbe is affected by the doping profile of the base well 28, the p-type third region 26c and/or the p-type well 30b. The beta is affected by the diffusion profile of the epitaxial layer 20 relative to the base well 28, the p-type third region 26c and/or the p-type well 30b; and the thickness of the layers of the base well 28, the p-type third region 26c and/or the p-type well 30b. More doping of the epitaxial layer 20 will lower the Rbe and thereby increase the trigger voltage/current. Increasing the thickness and/or width of the base well 28, the p-type third region 26c and/or the p-type well 30b reduces the beta and thereby increases Vcer. Increasing doping of the heavily n-type doped regions 36a, 36b, 36c increases beta and reduces the Vcer.

Beta and Rbe are affected by the diffusion profile of the epitaxial layer 20 relative to the base well 28, the p-type third region 26c and/or the p-type well 30b; and the diffusion profile of the buried layer 16. Making the epitaxial layer 20 thicker increases Vceo and increases the holding voltage. Making the base well 28, the p-type third region 26c and/or the p-type well 30b thicker, increases Vceo and increases the holding voltage.

The on-resistance is affected by the diffusion profile of the buried layer 16, the plug 46 and the n-type well 40a; and the base well 28, the p-type third region 26c and/or the p-type well 30b. Increasing the doping concentrations of the buried layer 16, the plug 46, the n-type well 40c, the base well 28, the p-type third region 26c and/or the p-type well 30b lowers the on-resistance.

Turning now to the first transistor QN2 specifically, the collector-base breakdown is affected by the diffusion profile of the epitaxial layer 20 and the buried layer 16 relative to the base well 28, the p-type fourth region 26d and the p-type well 30b. Thus, more doping of the epitaxial layer 20 and the buried layer 16 lowers the Vcbo and lowers the turn-on voltage. Making the distance between the plug 46a and the p-type fourth region 26d shorter, also lowers the Vcbo and lowers the turn-on voltage.

Rbe is affected by the doping profile of the base well 28, the p-type fourth region 26d and the p-type well 30b. The beta is affected by the diffusion profile of the epitaxial layer 20 relative to the base well 28, the p-type fourth region 26d and/or the p-type well 30b; and the thickness of the layers of the base well 28, the p-type fourth region 26d and/or the p-type well 30b. Increasing the doping of the epitaxial layer 20 will lower the Rbe and thereby increase the trigger voltage/current. Increasing the thickness and/or width of the base well 28, the p-type fourth region 26d and/or the p-type well 30b reduces the beta and thereby increases Vcer. Increasing the doping of the heavily n-type doped regions 36e increases beta and reduces the Vcer.

Beta and Rbe are affected by the diffusion profile of the epitaxial layer 20 relative to the base well 28, the p-type fourth region 26d and/or the p-type well 30b. Making the epitaxial layer 20 wider increases, Vceo and increases the holding voltage. Making the base well 28, the p-type fourth region 26d and/or the p-type well 30b thicker, increases Vceo and increases the holding voltage.

The on-resistance is affected by the diffusion profile of the buried layer 16, the plug 46 and the n-type well 40c; and the base well 28, p-type fourth region 26d and the p-type well 30b. Increasing the doping concentrations of the buried layer 16, the plug 46, the n-type well 40c, the base well 28, p-type fourth region 26d and/or the p-type well 30b lowers the on-resistance.

Figure 2:
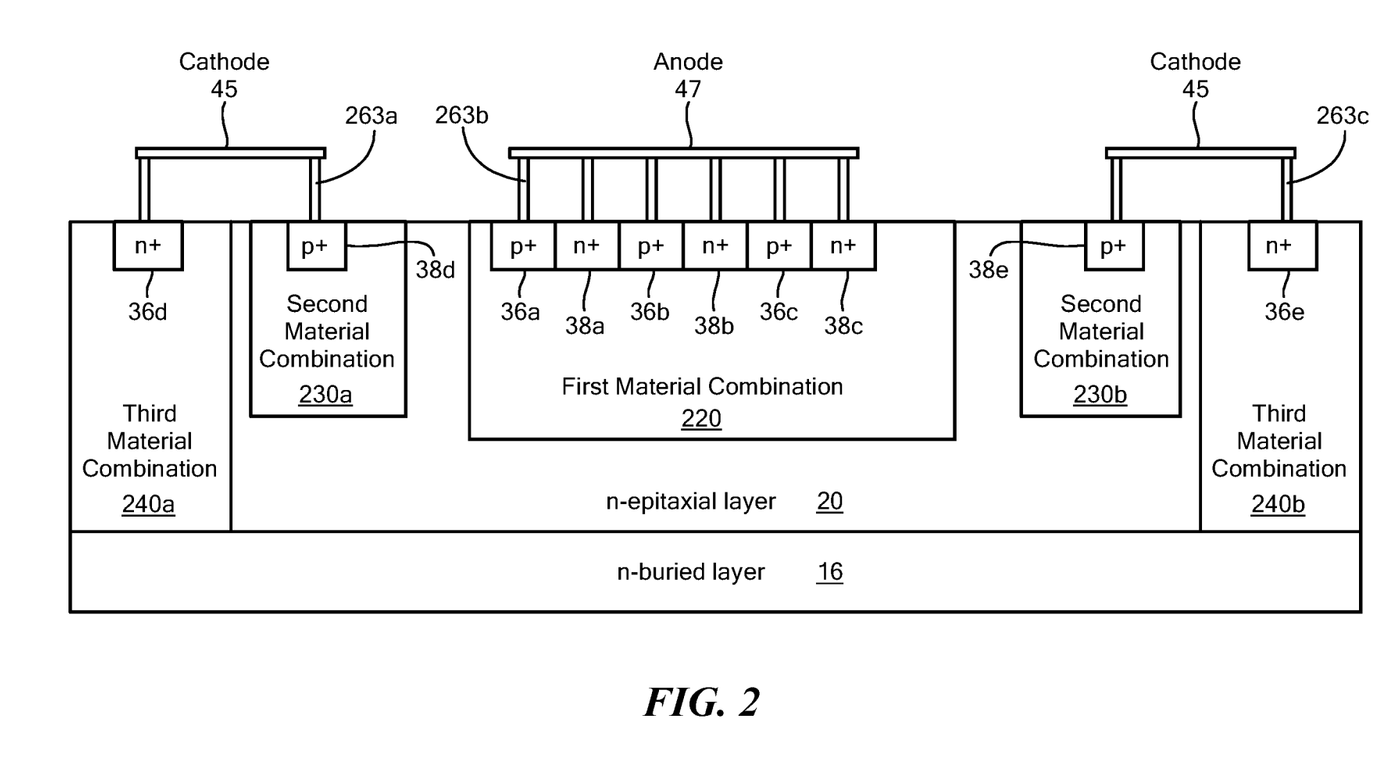
FIG. 2 is a cross-sectional view of another high-level example of a diode used as a ESD clamp with a first material combination, second material combinations and third material combinations.

Referring to FIG. 2, a diode 10' is a simplified version of the diode 10 (FIG. 1A). The diode 10' includes a first material combination 220, second material combinations (e.g., a second material combination 230a, a second material combination 230b) and third material combinations (e.g., a third material combination 240a, a third material combination 240b).

Vias connect an N+ region or P+ region to the cathode 45 or the anode 47. For example, a via 263a connects the heavily doped p-type region 38d to the cathode 45; a via 263b connects the heavily doped n-type region 36a to the anode 47; and a via 263c connects the heavily doped n-type region 36c to the cathode 45.

Figure 3A:
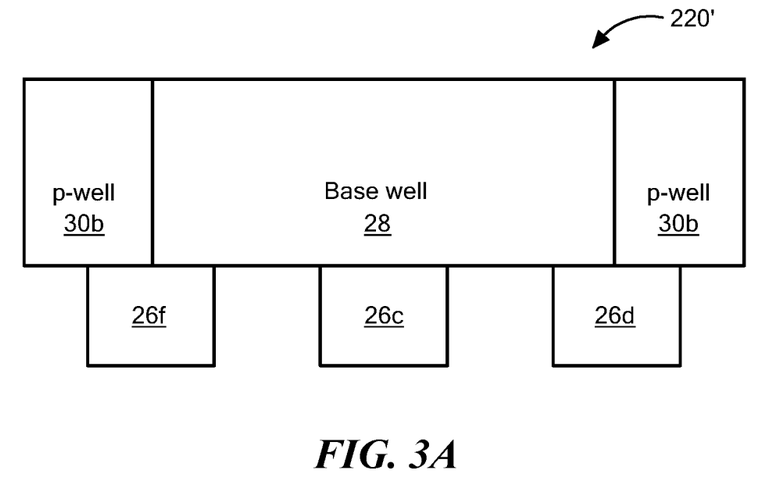
FIGS. 3A to 3C are diagrams of examples of configurations of the first material combination in FIG. 2.
Figure 3B:
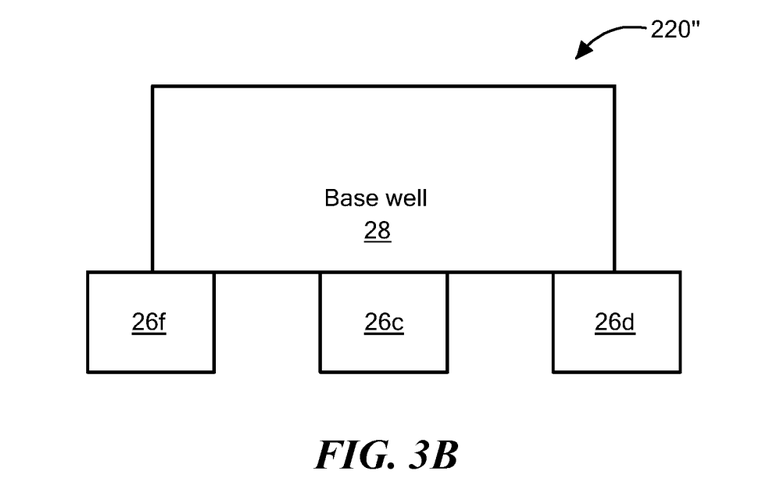
Figure 3C:
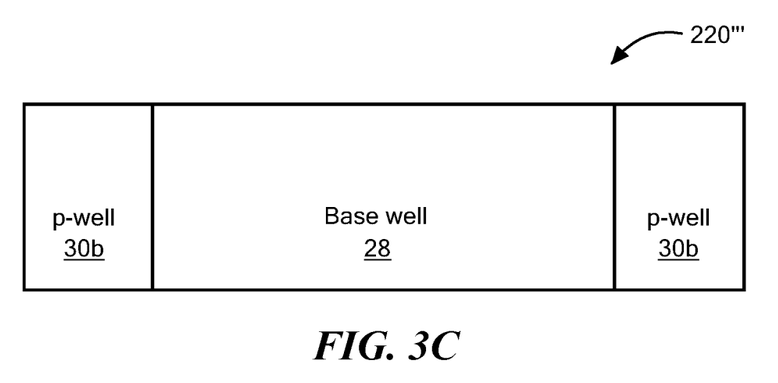

Referring to FIGS. 3A to 3C, the first combination material 220 may include different combinations. An example of the first combination material 220 is a first combination material 220', which includes the base well 28, the p-type well 30b and the p-type regions, 26c, 26d, 26f. A first combination material 220" is the same as the first combination material 220' but does not include the p-well 30b. A first combination material 220''' is the same as the first combination material 220' but does not include the p-type regions 26c, 26d, 26f.

Figure 4A:
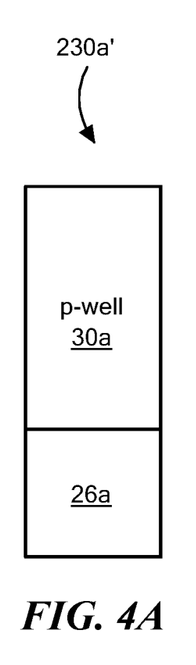
FIGS. 4A and 4B are diagrams of examples of configurations of the second material combinations in FIG. 2.
Figure 4B:
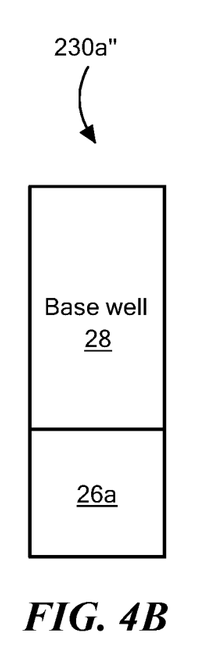

Referring to FIGS. 4A and 4B, the second combination material 230a, 230b may include different combinations. An example of the second combination material 230a is a second combination material 230a', which includes the p-type well 30a and the p-type region 26a. Another example of the second combination material 230a is a second combination material 230a", which includes the base well 28 and the p-type region 26a.

Figure 5A:
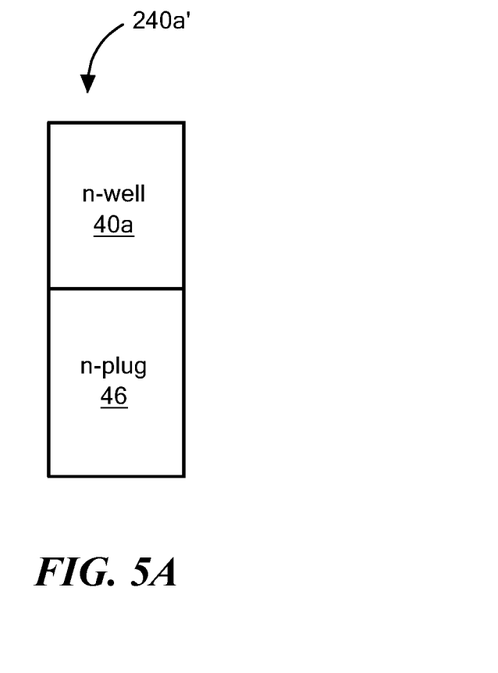
FIGS. 5A to 5C are diagrams of examples of configurations of the third material combinations in FIG. 2.
Figure 5B:
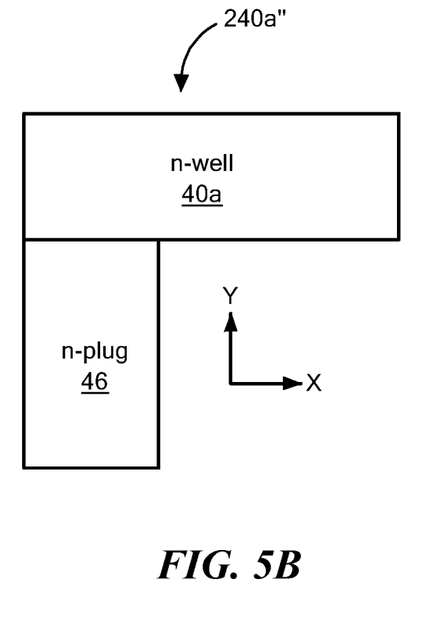
Figure 5C:
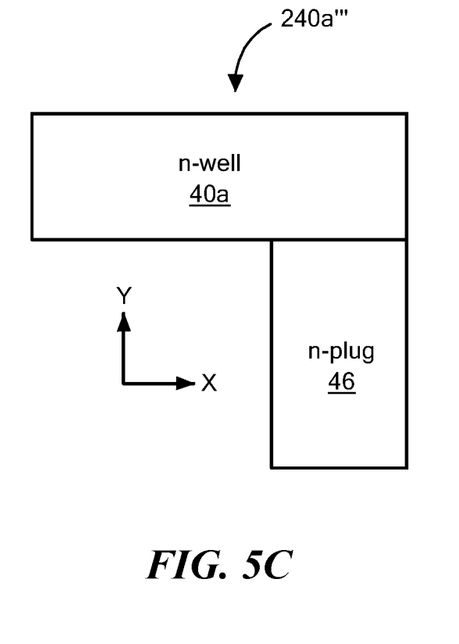

Referring to FIGS. 5A to 5C, the third combination material 240a, 240b may include different combinations. An example of the third combination material 240a is a third combination material 240a', which includes the n-type well 40a on the n-type plug 46.

Another example of the third combination 240a is a third combination 240a", which includes the n-type well 40a extending away from the n-type plug 46 in the x-direction. A further example of the third combination material 240a is a third combination material 240a''', which includes the n-type well 40a on the n-type plug 46 extending away from the n-type plug 46 in the negative x-direction. Other examples may have the n-type well 40a extending away from the n-type plug 46 in both the positive and negative x-directions.

Figure 6:
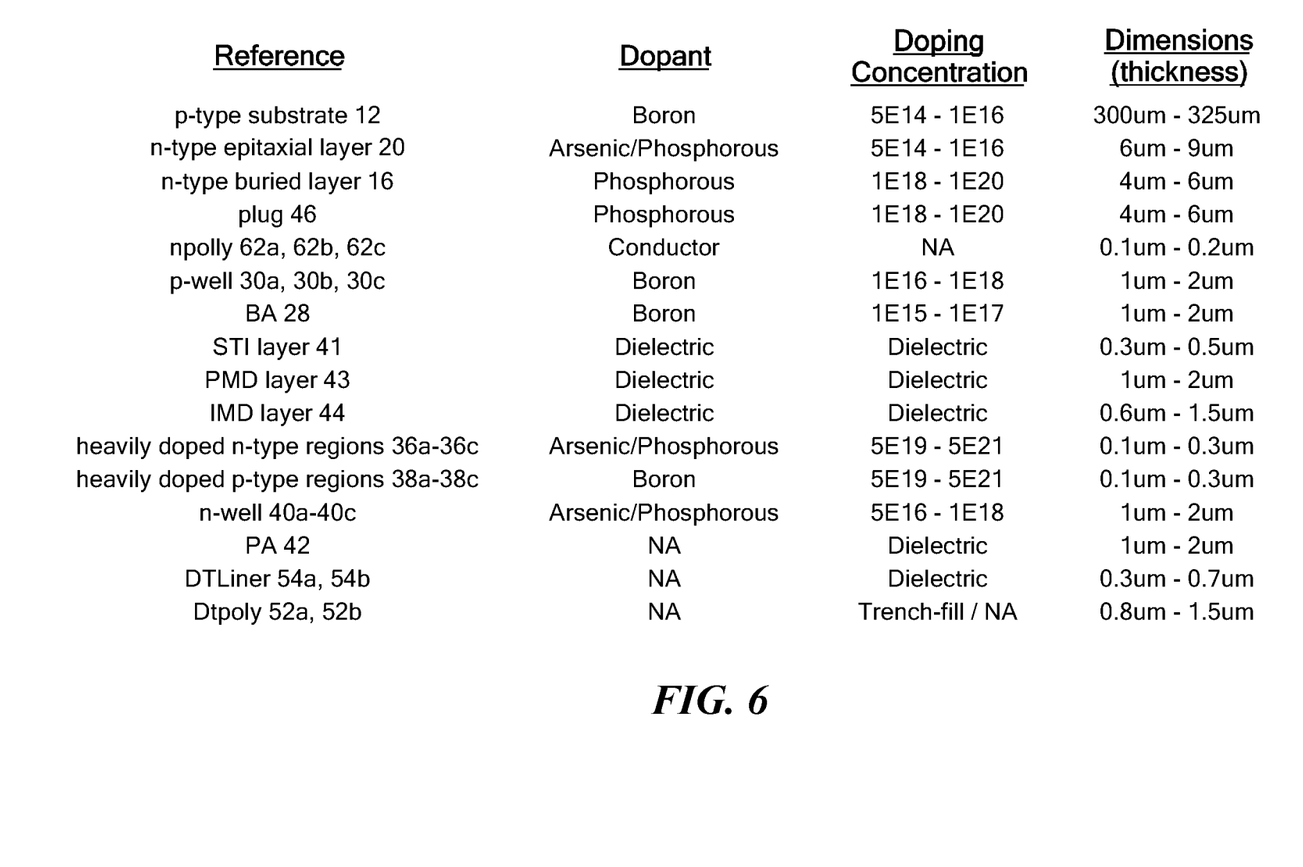
FIG. 6 is a table showing examples of parameters for some of the structures in FIG. 1A.

FIG. 6 depicts examples of doping concentrations and/or thicknesses of the elements in FIG. 1A that may be used.

Having described preferred embodiments, which serve to illustrate various concepts, structures, and techniques, which are the subject of this patent, it will now become apparent to those of ordinary skill in the art that other embodiments incorporating these concepts, structures and techniques may be used.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A diode comprising:
a substrate having a first type dopant;
a buried layer having a second type dopant and formed within the substrate;
an epitaxial layer having the second type dopant and formed above the buried layer;
a plurality of regions having the first type dopant within the epitaxial layer, wherein the plurality of regions comprises a first region, a second region, a third region, and a fourth region;
a base well having the first type dopant and located within the epitaxial layer and in contact with the third and fourth regions;
a first well having the second type dopant and formed in the epitaxial layer;
a second well having the first type dopant, and formed in the epitaxial layer, the second well extending into the first region;
a third well having the first type dopant located in the epitaxial layer and connected to the base well and connected to the second region and to the fourth region;
an anode;
a first heavily doped region having the second type dopant connected to the anode and the base well;
a second heavily doped region having the second type dopant connected to the anode and the base well; and
a cathode,
wherein in a reverse-bias mode, the diode is an electrostatic discharge (ESD) clamp and forms parasitic transistors comprising a first bipolar junction transistor (BJT), a second BJT and a third BJT.

2. The diode of claim 1, wherein the first BJT comprises:
an emitter formed by the second well and the first region;
a base formed by the epitaxial layer and the buried layer; and
a collector formed by the base well, the second region and the third well.

3. The diode of claim 2, wherein the second BJT comprises:
an emitter formed by the first and second heavily doped regions;
a base formed by the base well and the third region; and
a collector formed by the epitaxial layer and the buried layer.

4. The diode of claim 3, wherein the third BJT comprises:
an emitter formed by the first and second heavily doped regions and the fourth region;
a base formed by the base well, the fourth region and the third well; and
a collector formed by the epitaxial layer and the first well.

5. The diode of claim 1, wherein the second BJT comprises:
an emitter formed by the first and second heavily doped region;
a base formed by the base well and the third region; and
a collector formed by the epitaxial layer and the buried layer.

6. The diode of claim 1, wherein the third BJT comprises:
an emitter formed by the first and second heavily doped regions and the fourth region;
a base formed by the base well, the fourth region and the third well; and
a collector formed by the epitaxial layer and the first well.

7. The diode of claim 1, wherein the first type dopant is a p-type dopant, and the second type dopant is an n-type dopant.

8. The diode of claim 1, wherein the cathode is a ring-shaped cathode.

9. The diode of claim 1, wherein the second region is ring-shaped region.

10. The diode of claim 1, wherein the first well is a ring-shaped well.

11. The diode of claim 1, wherein the third well is a ring-shaped well.

12. The diode of claim 1, further comprising a plug, wherein the plug is in direct contact with the first well and the buried layer.

13. The diode of claim 1, further comprising:
a first heavily doped region of the first type dopant connected to the anode, the base well and the first heavily doped region of the second type dopant; and
a second heavily doped region of the first type dopant connected to the anode, the base well and the second heavily doped region of the second type dopant.

14. The diode of claim 1, further comprising:
a third heavily doped region having the first type dopant connected to the anode and the base well; and
a fourth heavily doped region of the first type dopant connected to the anode and the base well.

15. The diode of claim 1, wherein changing a thickness of the epitaxial layer changes one or more of breakdown current, holding voltage and/or trigger voltage of the diode.

16. The diode of claim 1, wherein changing one or more of a doping concentration of the base well, thickness of the base well and extension of the base well with respect to the anode changes one or more of breakdown current, holding voltage and/or trigger voltage of the diode.

17. The diode of claim 1, wherein the diode is a reduced injection diode.

* * * * *